(12) United States Patent
Yeh et al.

(10) Patent No.: US 10,804,124 B2
(45) Date of Patent: Oct. 13, 2020

(54) WAFER PROCESSING TOOL CAPABLE OF DETECTING WAFER WARPAGE AND METHOD FOR DETECTING WAFER WARPAGE

(71) Applicant: TAIWAN SEMICONDUCTOR MANUFACTURING CO., LTD., Hsinchu (TW)

(72) Inventors: Chao-Hsiung Yeh, Changhua County (TW); Hsuan Chang, Taichung (TW); Jen-Ti Wang, Taichung (TW); Chin-Tsan Chen, Taichung (TW); Kuo-Fong Chuang, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/217,907

(22) Filed: Dec. 12, 2018

(65) Prior Publication Data

US 2020/0105557 A1    Apr. 2, 2020

Related U.S. Application Data

(60) Provisional application No. 62/737,121, filed on Sep. 27, 2018.

(51) Int. Cl.
*G01B 11/16* (2006.01)
*H01L 21/67* (2006.01)

(52) U.S. Cl.
CPC ........ *H01L 21/67288* (2013.01); *G01B 11/16* (2013.01); *G01B 2210/56* (2013.01)

(58) Field of Classification Search
CPC .............. G01N 21/9501; G01N 21/00; G01N 21/9505; G01N 21/8851; G01B 11/306; G01B 11/16; G03F 7/70783
USPC ................... 356/237.1–237.5, 600, 612, 622
See application file for complete search history.

(56) References Cited

U.S. PATENT DOCUMENTS

| | | | | |
|---|---|---|---|---|
| 5,483,138 A * | 1/1996 | Shmookler | ........... | H01L 21/681 318/568.16 |
| 6,407,809 B1 * | 6/2002 | Finarov | .............. | G01N 21/9501 356/237.3 |
| 6,791,680 B1 * | 9/2004 | Rosengaus | ......... | G01N 21/9501 356/237.2 |
| 7,607,647 B2 * | 10/2009 | Zhao | ..................... | B25B 11/005 269/20 |
| 2001/0030924 A1 * | 10/2001 | Trezza | ............... | G11B 7/08547 369/53.19 |
| 2007/0229833 A1 * | 10/2007 | Rosencwaig | ........ | G01N 21/474 356/426 |
| 2012/0293188 A1 * | 11/2012 | Nikolenko | ............... | G01B 7/06 324/655 |

(Continued)

*Primary Examiner* — Hoa Q Pham
(74) *Attorney, Agent, or Firm* — Maschoff Brennan

(57) ABSTRACT

A wafer processing tool is capable of detecting wafer warpage. The wafer processing tool includes a wafer holder on which a wafer is held and at least one sensor set. The at least one sensor set is disposed above the wafer or under the wafer, and a projection of each of the at least one sensor set on the wafer radially extending from a center of the wafer to an edge of the wafer. The at least one sensor set is configured to scan an entire surface of the wafer so as to measure warpage of the wafer while the wafer holder and the at least one sensor set are rotatable relative to each other.

20 Claims, 13 Drawing Sheets

(56) References Cited

U.S. PATENT DOCUMENTS

2013/0154675 A1\* 6/2013 Miyazaki ........... G01N 21/9501
324/750.01
2013/0183627 A1\* 7/2013 Shibazaki ............. G03F 7/7035
430/325

\* cited by examiner

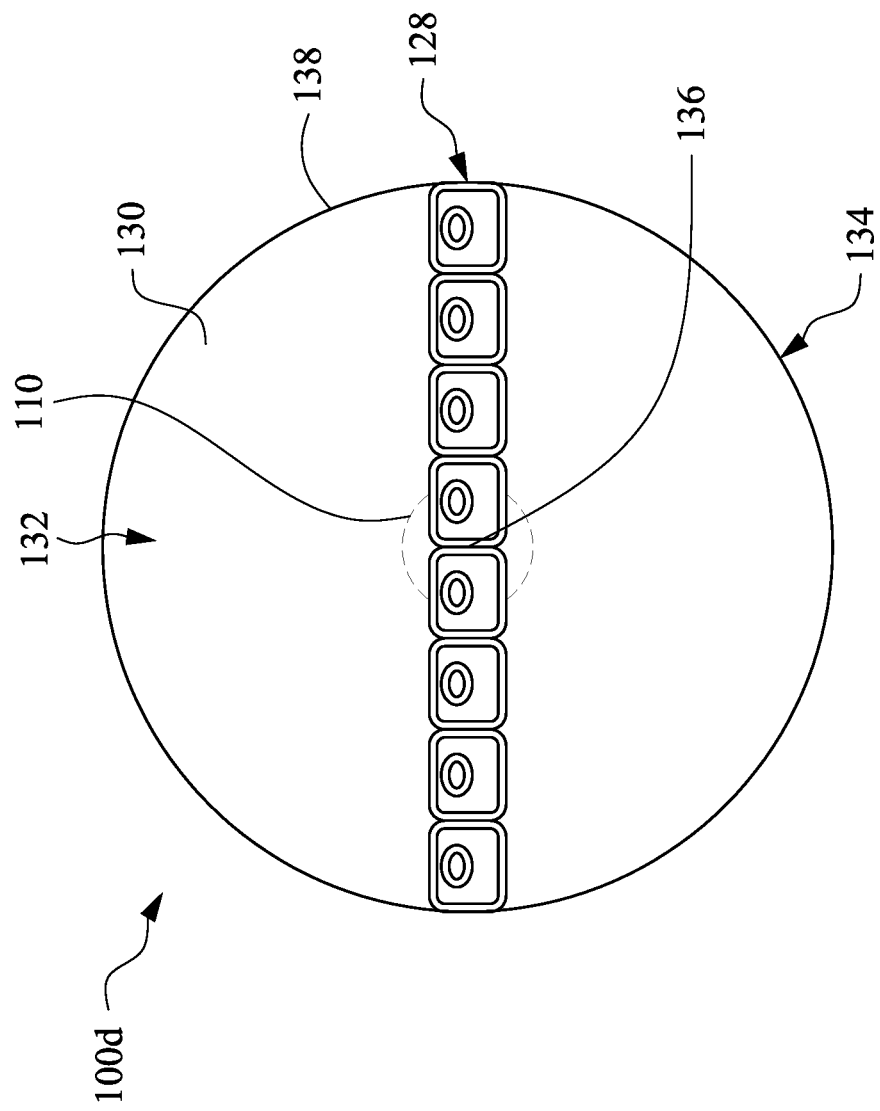

WAFER PROCESSING TOOL CAPABLE OF DETECTING WAFER WARPAGE AND METHOD FOR DETECTING WAFER WARPAGE

RELATED APPLICATIONS

This application claims priority to U.S. Provisional Application Ser. No. 62/737,121, filed Sep. 27, 2018, which is herein incorporated by reference.

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments of tools and methods for measuring wafers during IC manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is a schematic top view of a wafer and a sensor set of a wafer processing tool capable of detecting wafer warpage in accordance with some embodiments.

DETAILED DESCRIPTION

Figure 1:
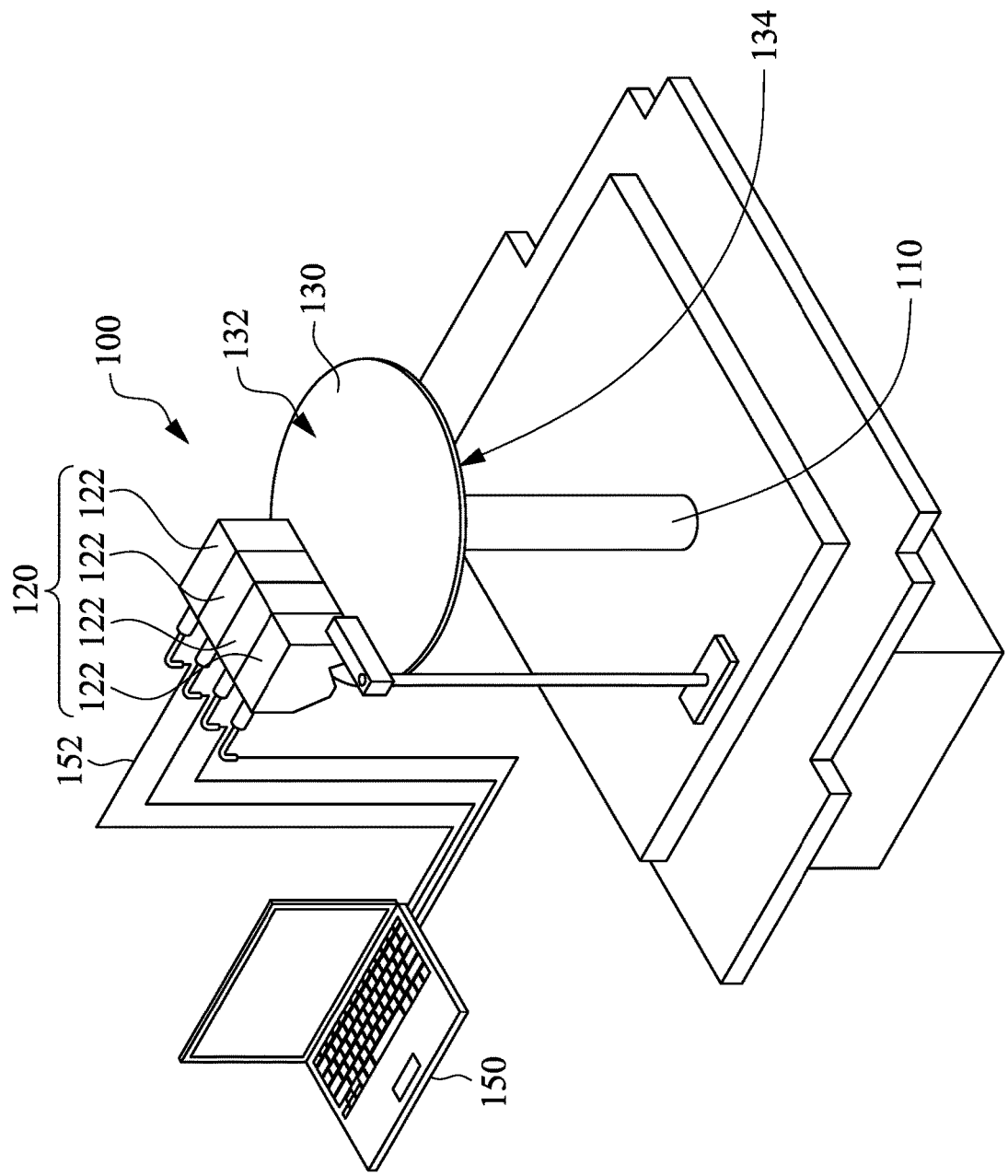
FIG. 1 is a schematic diagram of a wafer processing tool capable of detecting wafer warpage in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the some embodiments and/or configurations discussed. As used herein, the term "and/or" includes any and all combinations of one or more of the associated listed items.

Semiconductor devices are formed by stacking multiple layers of materials on a wafer. Stresses may be formed between the layers of different materials to induce crack of some of the layers, such as passivation layers, and resulting in poor reliability of the semiconductor devices. The combination of the material layers applying stress to the wafer results in significant warpage of the wafer, such that the warpage of the wafer can be used to monitor the stresses in the material layers.

Embodiments of the present disclosure are directed to providing a wafer processing tool capable of detecting wafer warpage and a method for detecting wafer warpage. The wafer processing tool includes at least one sensor set, in which a projection of each of the at least one sensor set on a wafer radially extends from a center of the wafer to an edge of the wafer, or a projection of each of the at least one sensor set on a wafer crosses two opposite edges of the wafer and passes through the center of the wafer, such that the at least one sensor set may scan an entire surface of the wafer while the wafer holder and the at least one sensor set are rotated relative to each other, thereby efficiently obtaining a topography of the entire surface of the wafer. Thus, warpage of the entire wafer can be easily detected and monitored. Process parameters and materials used in processes then can be modified according to the warpage of the wafer, so as to improve process yield and product quality.

Figure 2:
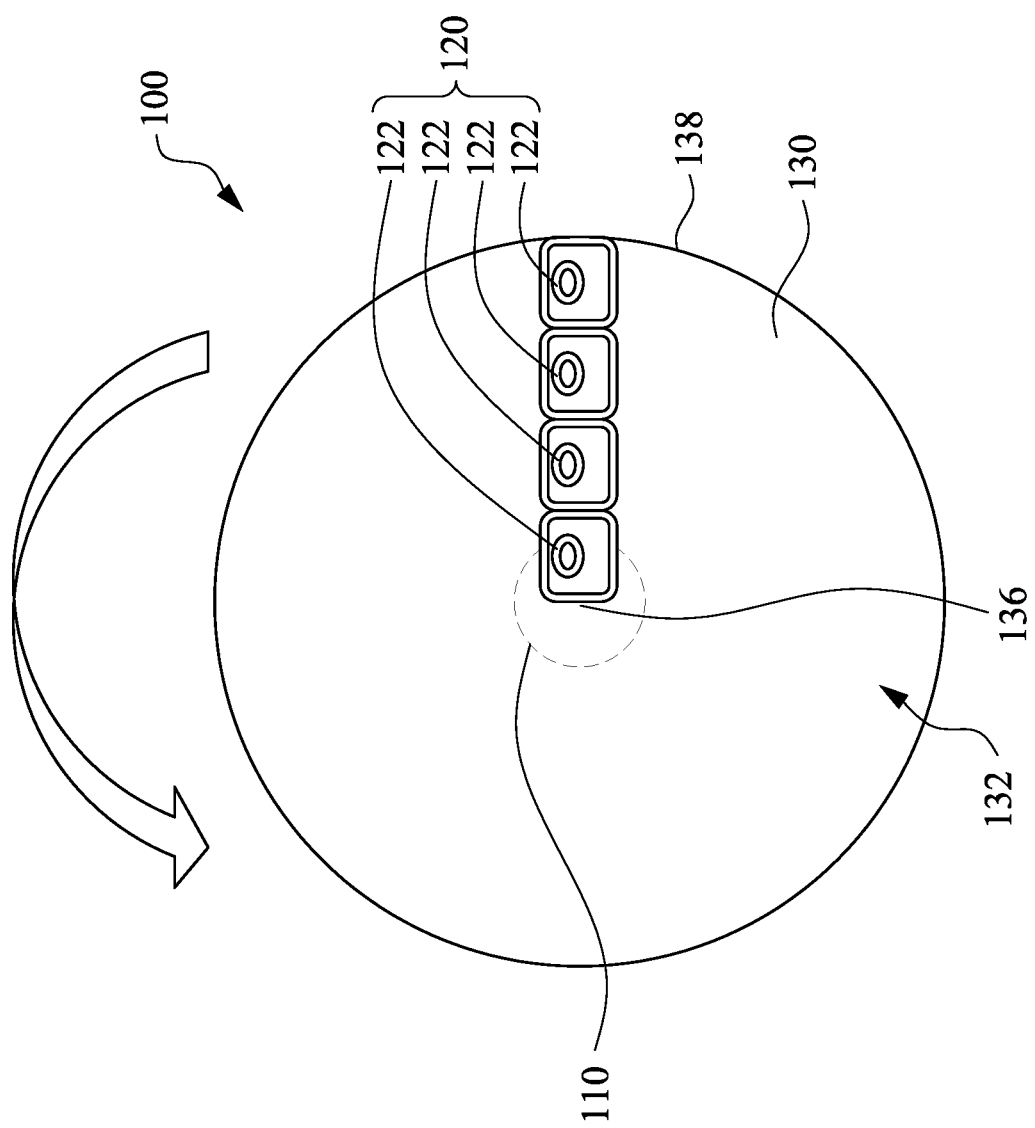
FIG. 2 is a schematic top view of a wafer and a sensor set of a wafer processing tool capable of detecting wafer warpage in accordance with some embodiments.

FIG. 1 is a schematic diagram of a wafer processing tool 100 capable of detecting wafer warpage in accordance with some embodiments, and FIG. 2 is a schematic top view of a wafer 130 and a sensor set 120 of the wafer processing tool 100. The wafer processing tool 100 may be, for example, a sorter or a process tool. The wafer sorter is used for sorting wafers in wafer transfer. The process tool is designed to process a wafer. For example, the process tool may be a deposition process tool for depositing various material layers on the wafer, or a planarization process tool such as a chemical mechanical polishing (CMP) process tool for planarizing the material layers. In some embodiments, the wafer processing tool 100 includes a wafer holder 110 and at least one sensor set 120. In the examples shown in FIG. 1, the wafer processing tool 100 includes one sensor set 120. The wafer holder 110 is configured to support and hold a wafer 130. In some exemplary examples, the wafer holder 110 may be a clamp type holder, a chuck type holder, an e-chuck type holder, or a vacuum type holder, such that the wafer holder 110 may hold the wafer 130 by using a mechanical force, an electrostatic force, or a vacuum force. The wafer holder 110 and the sensor set 120 are rotatable relative to each other, such that the wafer 130 held by the wafer holder 110 and the sensor set 120 are rotatable relative to each other.

The sensor set 120 may include one or more sensors 122. In the examples shown in FIG. 2, the sensor set 120 includes four sensors 122, in which the sensors 122 may be uniformly arranged in a line of the wafer 130. In some examples, when the wafer 130 is held on the wafer holder 110, a projection of the sensor set 120 on the wafer 130 radially extends from a center 136 of the wafer 130 to an edge 138 of the wafer 130. That is the sensor set 120 may at least cover a radius of the wafer 130. For example, the sensors 122 of the sensor set 120 may include ultrasonic sensors, optical sensors, RF coupling sensors, or a combination thereof. The sensor set 120 and the wafer holder 110 are rotatable relative to each other, such that the sensor set 120 may be rotatable relative to the wafer 130 held on the wafer holder 110.

In some exemplary examples, the wafer processing tool 100 further includes a process device 150, such as a computer including a central processing unit (CPU). The sensors 122 of the sensor set 120 are signally connected to the process device 150. For example, the sensors 122 of the sensor set 120 may be signally connected to the process device 150 by transmission lines 152. In alternative examples, the sensors 122 of the sensor set 120 are signally connected to the process device 150 by wireless transmission. For example, in the examples that the sensor set 120 is rotatable relative to the wafer holder 110, the sensors 122 of the sensor set 120 are signally connected to the process device 150 by wireless transmission. The sensors 122 of the sensor set 120 scan the entire top surface 132 of the wafer 130 and obtain the topography data of the entire top surface 132 of the wafer 130. Then, the sensors 122 transmit the topography data of the entire top surface 132 of the wafer 130 to the process device 150. The process device 150 measures the warpage of the wafer 130 by using the topography data of the entire top surface 132 of the wafer 130.

Figure 3A:
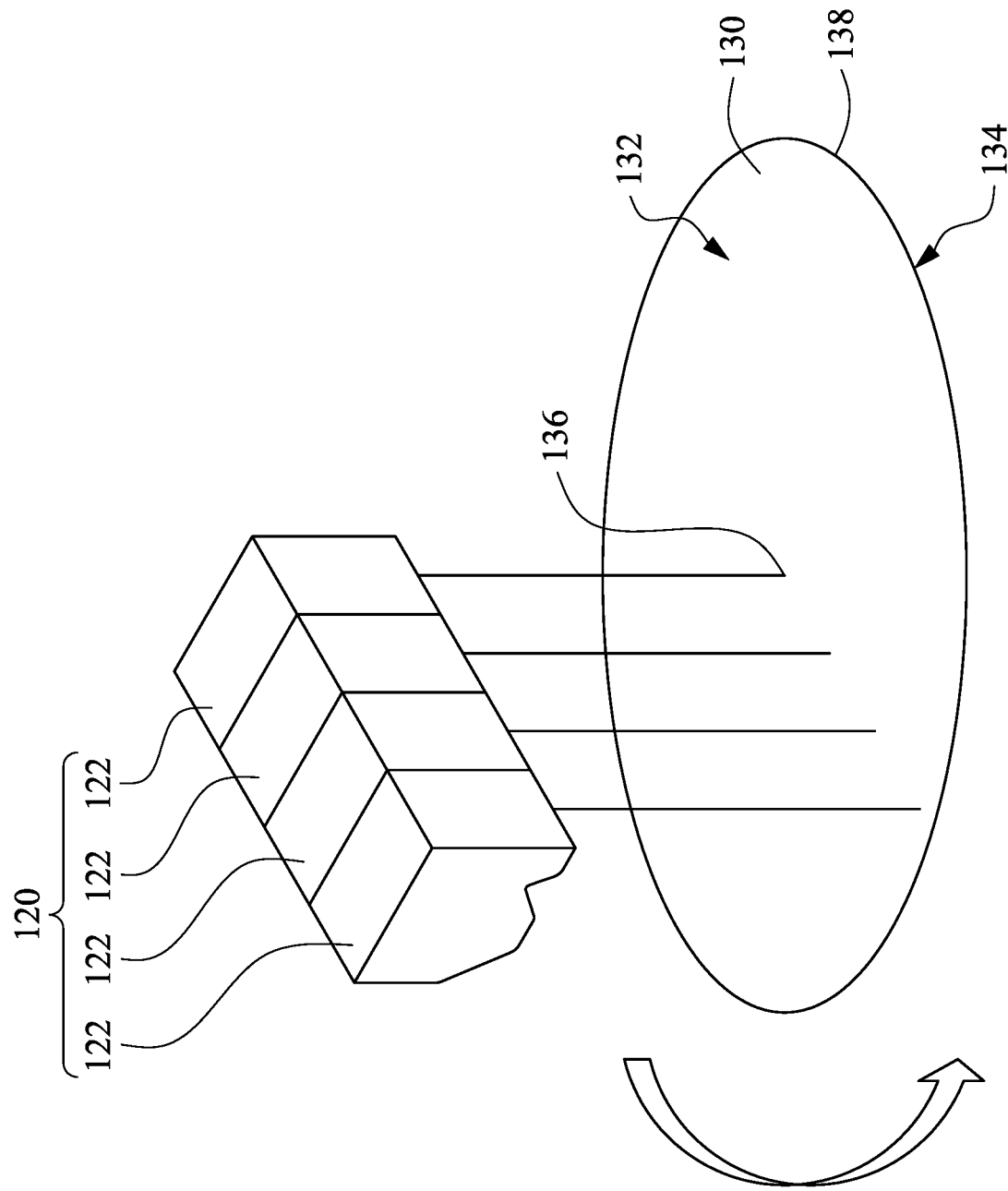
FIG. 3A and FIG. 3B are schematic views showing a sensor set disposed above a wafer in accordance with some embodiments.

FIG. 3A is a schematic view of a wafer and a sensor set of a wafer processing tool capable of detecting wafer warpage in accordance with some embodiments. As shown in FIG. 3A, the sensor set 120 is configured to scan a top surface 132 of the wafer 130. The top surface 132 is opposite to a back surface 134 of the wafer 130. For example, the wafer 130 has a patterned side on which devices are formed and a back side which is opposite to the patterned side, in which the top surface 132 of the wafer 130 may be at the patterned side, and the back surface 134 of the wafer 130 may be at the back side. In some examples, the sensor set 120 is disposed above the top surface 132 of the wafer 130. In alternative examples, the sensor set 120 is disposed under the back surface 134 of the wafer 130. In the examples shown in FIG. 3A, the sensor set 120 is disposed directly above the top surface 132 of the wafer 130.

In some examples, the wafer holder 110 is rotatable relative to the sensor set 120, and the sensor set 120 cannot rotate. In alternative examples, the sensor set 120 is rotatable relative to the wafer holder 110, and the wafer holder 110 cannot rotate. In certain examples, the wafer holder 110 and the sensor set 120 are rotatable relative to each other. In the examples shown in FIG. 2 and FIG. 3A, the wafer holder 110 is rotatable relative to the sensor set 120, and the sensor set 120 cannot rotate. In such examples, when the wafer holder 110 rotates relative to the sensor set 120, the sensor set 120 scans the top surface 132 of the wafer 130. The projection of the sensor set 120 on the wafer 130 radially extends from the center 136 of the wafer 130 to the edge 138 of the wafer 130, such that when the wafer holder 110 rotates relative to the sensor set 120 by 360 degrees, the sensor set 120 scans and detects the entire top surface 132 of the wafer 130 to obtain a topography of the entire top surface 132 of the wafer 130. The warpage of the wafer 130 is measured by using the topography data of the entire top surface 132 of the wafer 130.

Figure 3B:
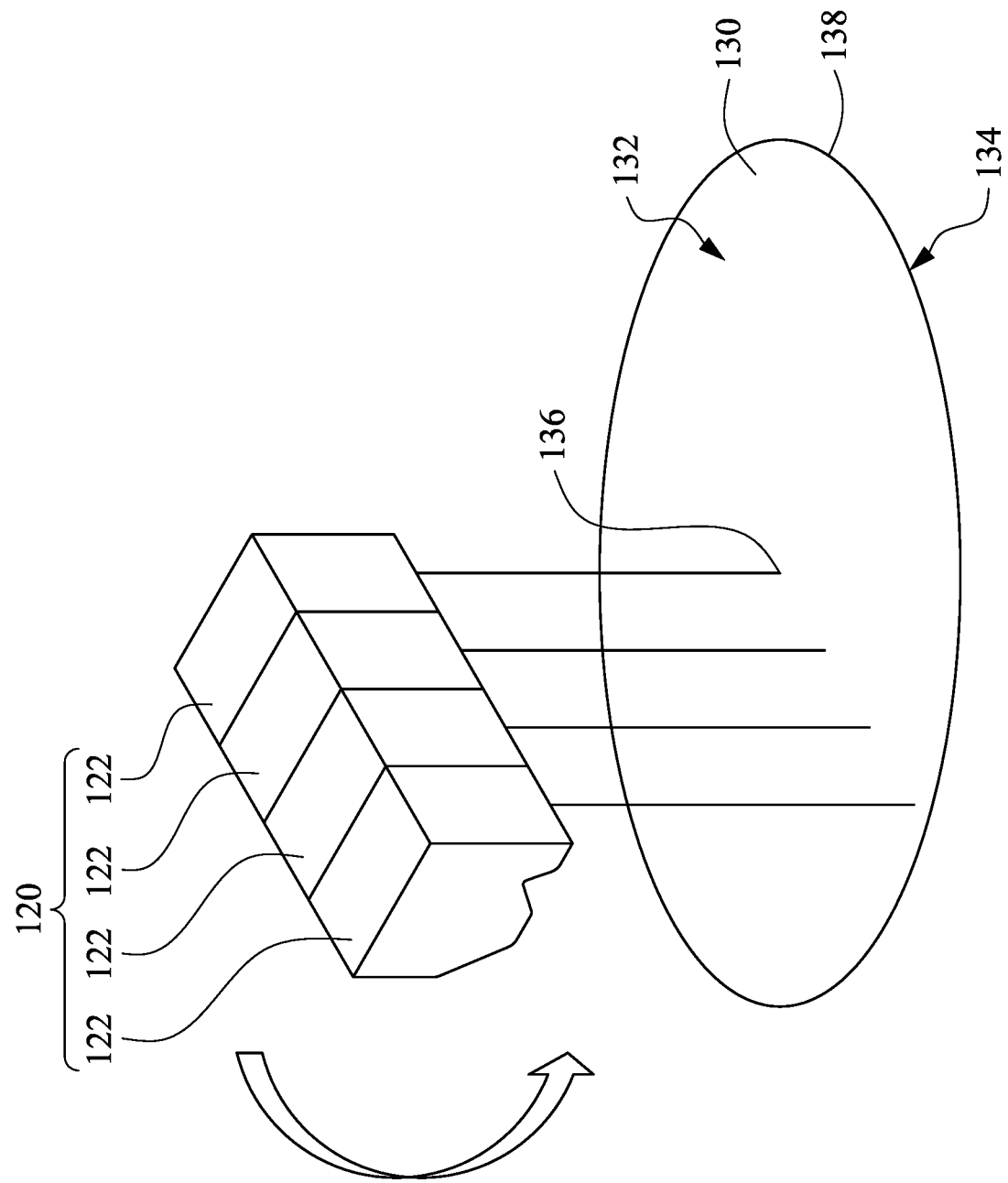

FIG. 3B is a schematic view of a wafer and a sensor set of a wafer processing tool capable of detecting wafer warpage in accordance with some embodiments. In the examples, the sensor set 120 is rotatable relative to the wafer holder 110, and the wafer holder 110 cannot rotate. When the wafer 130 is held on the wafer holder 110, the sensor set 120 is disposed directly above the top surface 132 of the wafer 130. In some exemplary examples, a projection of the sensor set 120 on the wafer 130 radially extends from the center 136 of the wafer 130 to the edge 138 of the wafer 130 to cover the radius of the wafer 130. While the sensor set 120 rotates relative to the wafer holder 110 by 360 degrees, the sensor set 120 scans and detects the entire top surface 132 of the wafer 130 to obtain the topography of the entire top surface 132 of the wafer 130.

Figure 4:
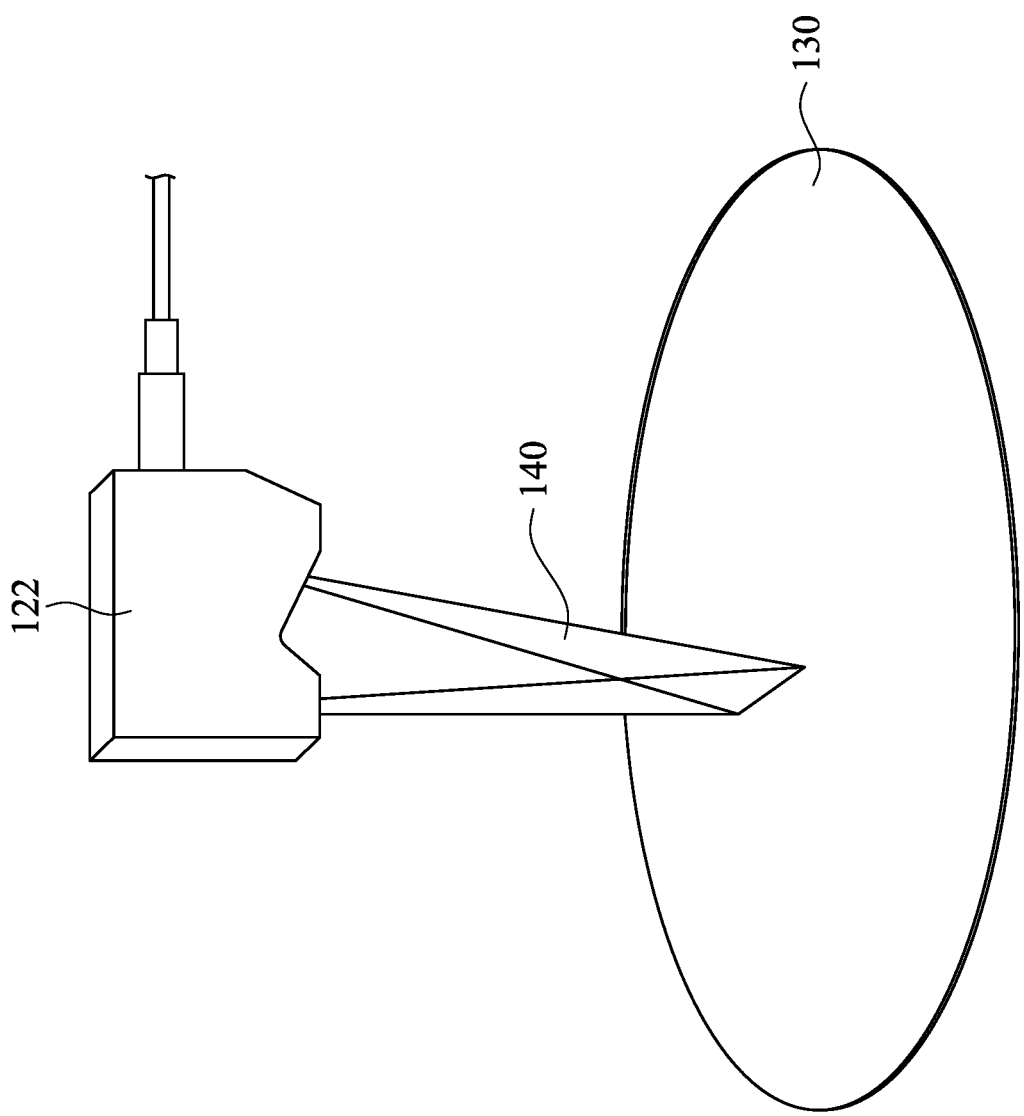
FIG. 4 is a schematic diagram showing a detecting operation of a sensor of the sensor set shown in FIG. 3A or FIG. 3B.

FIG. 4 is a schematic diagram showing a detecting operation of a sensor of the sensor set shown in FIG. 3A or FIG. 3B. In some exemplary examples, the sensors 122 of the sensor set 120 are optical sensors. During the detecting operation, each of the sensors 122 may emit a light beam 140 toward the top surface 132 or the back surface 134 of the wafer 130, and the light beam 140 is reflected back to the sensor 122 by the top surface 132 or the back surface 134 of the wafer 130, such that the sensors 122 can detect relative distances between any positions of the entire top surface 132 or the entire back surface 134 of the wafer 130 and the sensors 122, and thus obtaining the topography of the entire top surface 132 or the entire back surface 134 of the wafer 130.

By arranging the sensor set 120 to at least cover the radius of the wafer 130 and rotating the wafer holder 110 relative to the sensor set 120, the sensor set 120 detects the topography of the entire top surface 132 of the wafer 130 rapidly, such that the warpage of the entire wafer 130 is efficiently measured. Thus, the stress of the wafer 130 is monitored according to the warpage trend of the wafer 130. Therefore, process parameters and materials used in the processes for manufacturing the devices on the wafer 130 can be modified according to measurement result of the warpage of the wafer 130, thereby increasing process yield and reliability of product.

Figure 5A:
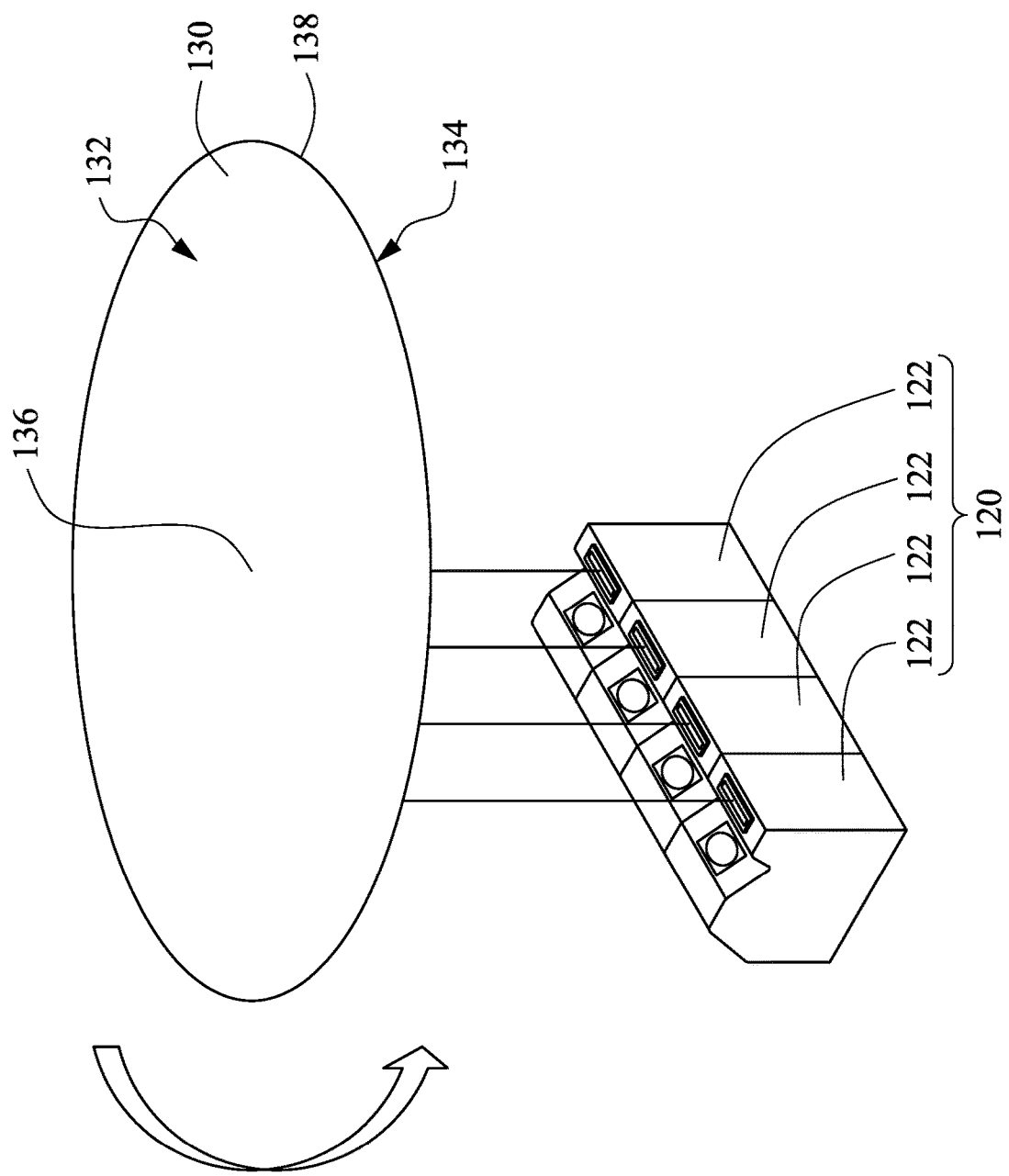
FIG. 5A and FIG. 5B are schematic views showing a sensor set disposed under a wafer in accordance with some embodiments.

FIG. 5A is a schematic view of a wafer and a sensor set of a wafer processing tool capable of detecting wafer warpage in accordance with some embodiments. In the embodiments, the wafer 130 is held on the wafer holder 110, and the sensor set 120 is disposed directly under the back surface 134 of the wafer 130. Similarly, a projection of the sensor set 120 on the wafer 130 radially extends from the center 136 of the wafer 130 to the edge 138 of the wafer 130. The sensor set 120 scans and detects the entire back surface 134 of the wafer 130 while the wafer holder 110 rotates relative to the sensor set 120 by 360 degrees, such that a topography of the entire back surface 134 of the wafer 130 is detected. The warpage of the wafer 130 is measured according to the topography of the entire back surface 134 of the wafer 130.

Figure 5B:
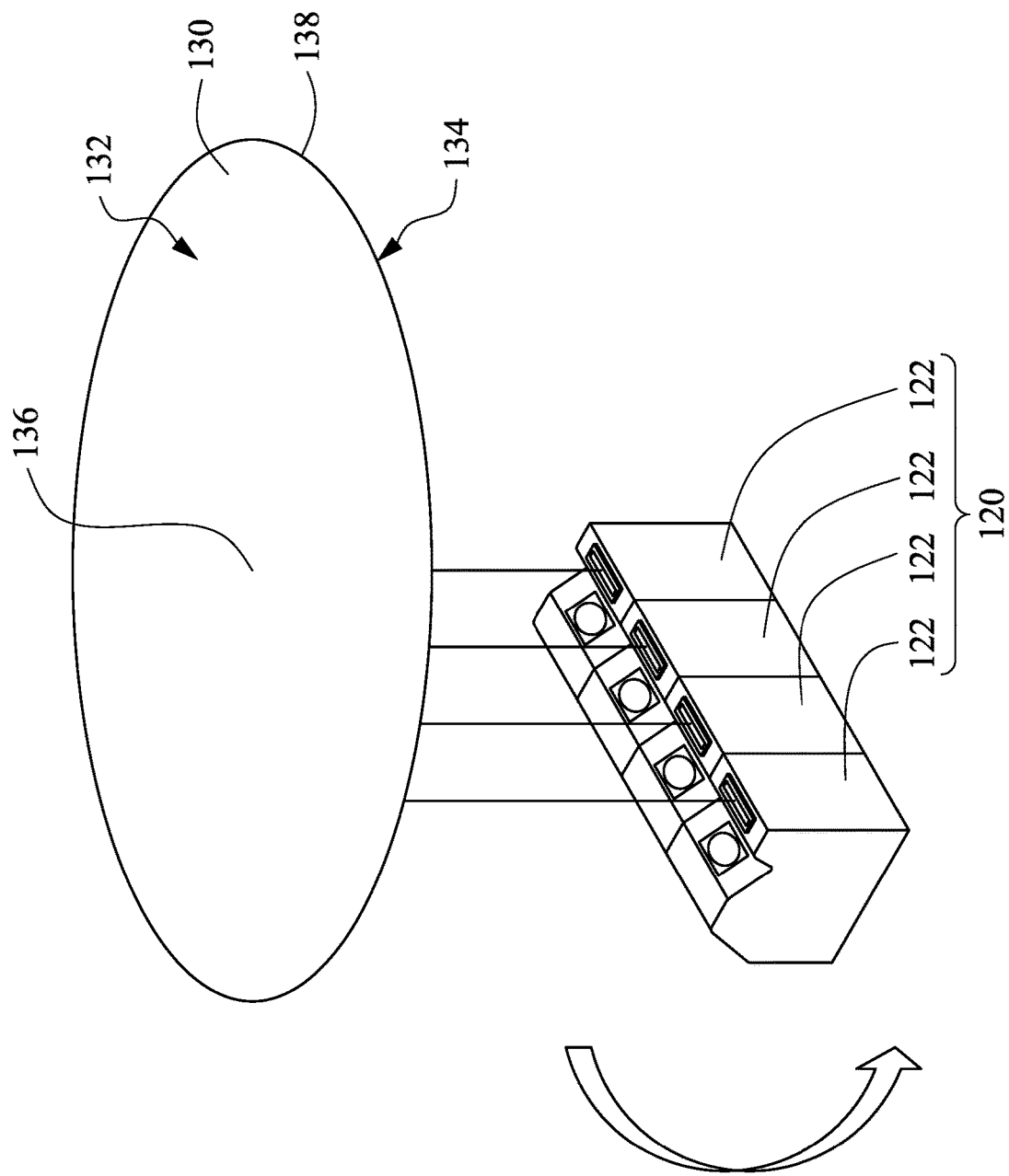

FIG. 5B is a schematic view of a wafer and a sensor set of a wafer processing tool capable of detecting wafer warpage in accordance with some embodiments. In the examples, the wafer 130 is disposed and held on the wafer holder 110, and the sensor set 120 is disposed directly under the back surface 134 of the wafer 130. A projection of the sensor set 120 on the wafer 130 radially extends from the center 136 of the wafer 130 to the edge 138 of the wafer 130 to cover the radius of the wafer 130. While the sensor set 120 rotates relative to the wafer holder 110 by 360 degrees, the sensor set 120 scans and detects the entire back surface 134 of the wafer 130, such that the topography of the entire back surface 134 of the wafer 130 is obtained by the sensor set 120.

Figure 6A:
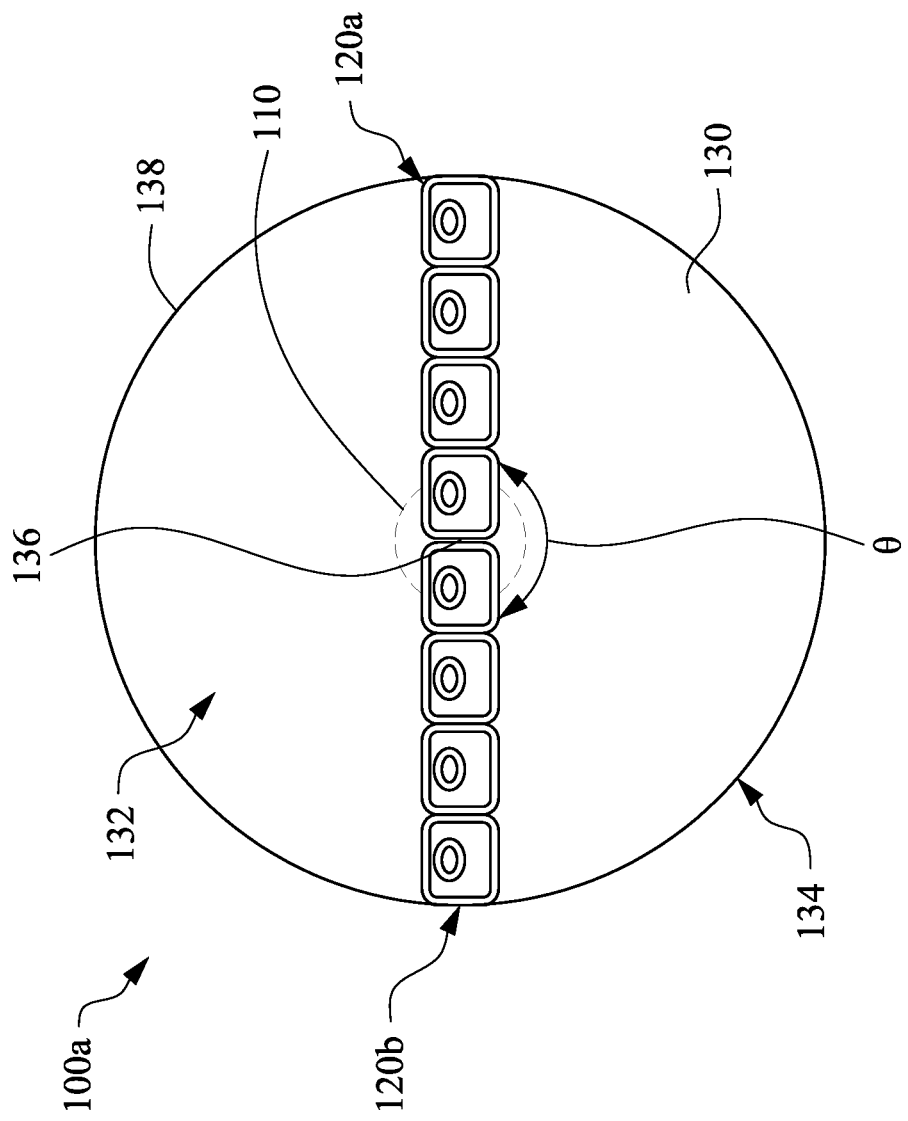
FIG. 6A is a schematic top view of a wafer and a sensor set on a wafer processing tool capable of detecting wafer warpage in accordance with some embodiments.

In some examples, the wafer processing tool may include two or more sensor sets, and included angles between every two adjacent sensor sets may be the same. In addition, each of the included angles between every two adjacent sensor sets may substantially equal to 360/n degrees, where n stands for the number of the sensor sets. Referring to FIG. 6A, FIG. 6A is a schematic top view of a wafer and a sensor set on a wafer processing tool capable of detecting wafer warpage in accordance with some embodiments. In the embodiments, a wafer processing tool 100a includes a wafer holder 110 and two sensor sets 120a and 120b. The sensor sets 120a and 120b are arranged in a line of the wafer 130, and a projection of each of the sensor sets 120a and 120b on the wafer 130 radially extends from a center 136 of the wafer to an edge 138 of the wafer 130. Thus, the sensor sets 120a and 120b cover a diameter of the wafer 130. An included angle θ between the sensor sets 120a and 120b may substantially equal to 360/2 (i.e. 180) degrees.

As shown in FIG. 6A, the wafer processing tool 100a includes two sensor sets 120a and 120b, and sensor sets 120a and 120b are arranged to cover the diameter of the wafer 130, such that the sensor sets 120a and 120b scan and detect the entire top surface 132 or the entire back surface 134 of the wafer 130 while the wafer holder 110 rotates relative to each of the sensor sets 120a and 120b by 180 degrees or each of the sensor sets 120a and 120b rotates relative to the wafer holder 110 by 180 degrees. Thus, the time for detecting the warpage of the wafer 130 is reduced.

Figure 6B:
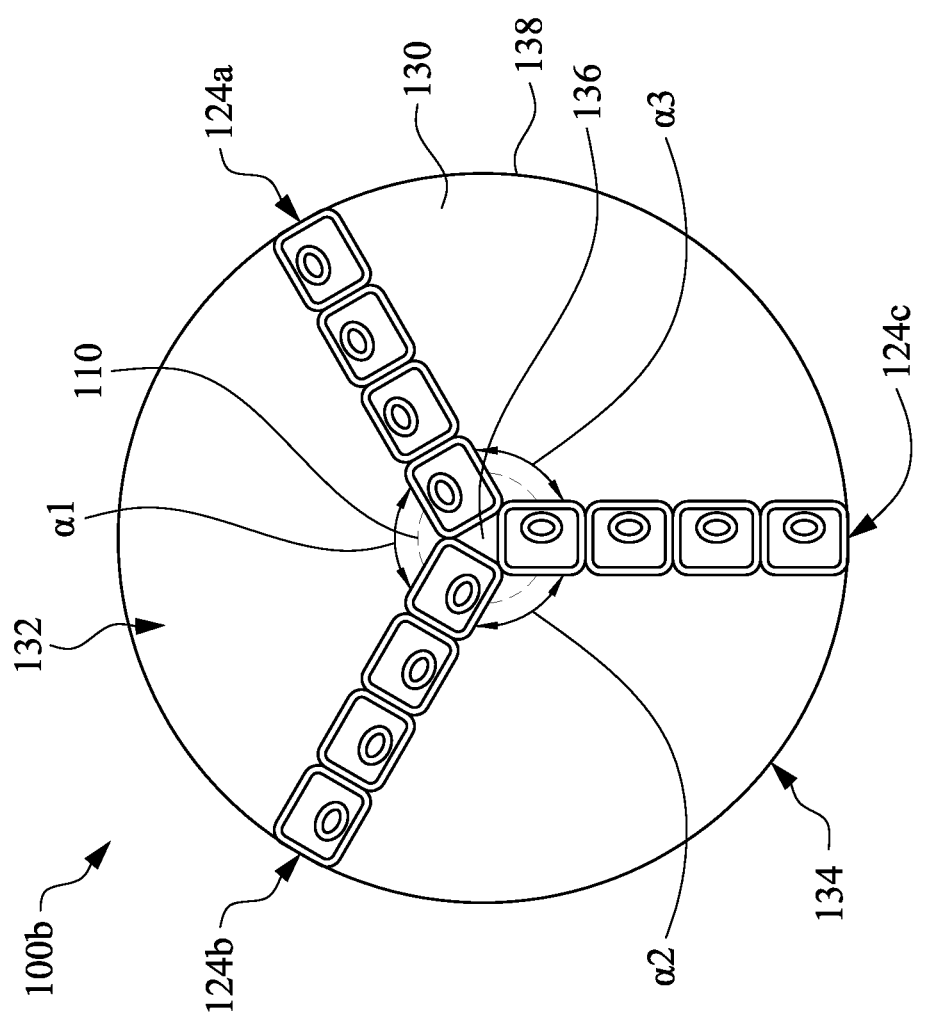
FIG. 6B is a schematic top view of a wafer and a sensor set on a wafer processing tool capable of detecting wafer warpage in accordance with some embodiments.

FIG. 6B is a schematic top view of a wafer and a sensor set on a wafer processing tool capable of detecting wafer warpage in accordance with some embodiments. In the embodiments, a wafer processing tool 100b includes a wafer holder 110 and three sensor sets 124a, 124b, and 124c. The sensor sets 124a, 124b, and 124c are radially arranged, and a projection of each of the sensor set 124a, 124b, and 124c on the wafer 130 radially extends from a center 136 of the wafer 130 to an edge 138 of the wafer 130, such that each of the sensor set 124a, 124b, and 124c covers a radius of the wafer 130. In some exemplary examples, an included angle α 1 between the sensor sets 124a and 124b, an included angle α 2 between the sensor sets 124b and 124c, and an included angle α 3 between the sensor sets 124c and 124a are the same. Each of the included angles α 1, α 2, and α 3 may substantially equal to 360/3 (i.e. 120) degrees.

Referring to FIG. 6B again, because the wafer processing tool 100b includes three sensor sets 124a, 124b, and 124c, the sensor sets 124a, 124b, and 124c are radially arranged to respectively cover the radiuses of the wafer 130, and the included angles α 1, α 2, and α 3 are the same, such that the sensor sets 124a, 124b, and 124c scan and detect the entire top surface 132 or the entire back surface 134 of the wafer 130 while the wafer holder 110 rotates relative to each of the sensor sets 124a, 124b, and 124c by 120 degrees or each of the sensor sets 124a, 124b, and 124c rotates relative to the wafer holder 110 by 120 degrees. Thus, the time for detecting the warpage of the wafer 130 is further reduced.

Figure 6C:
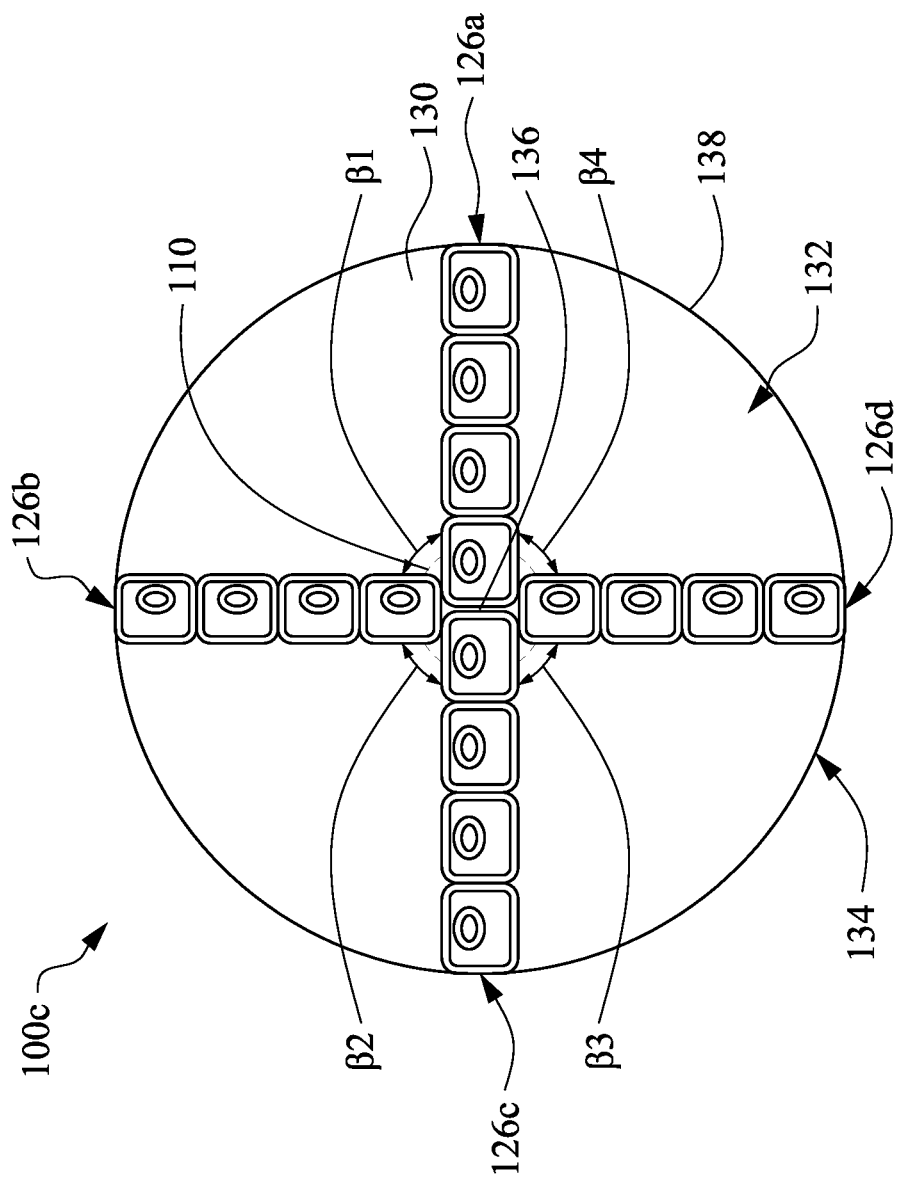
FIG. 6C is a schematic top view of a wafer and a sensor set of a wafer processing tool capable of detecting wafer warpage in accordance with some embodiments.

FIG. 6C is a schematic top view of a wafer and a sensor set on a wafer processing tool capable of detecting wafer warpage in accordance with some embodiments. In the embodiments, a wafer processing tool 100c includes a wafer holder 110 and four sensor sets 126a, 126b, 126c, and 126d. The sensor sets 126a, 126b, 126c, and 126d are radially arranged, and a projection of each of the sensor set 126a, 126b, 126c, and 126d on the wafer 130 radially extends from a center 136 of the wafer 130 to an edge 138 of the wafer 130, such that each of the sensor sets 126a, 126b, 126c, and 126d covers a radius of the wafer 130. In addition, the sensor sets 126a and 126c are disposed in a line, and the sensor sets 126b and 126d are disposed in a line. The sensor sets 126a and 126c cover a diameter of the wafer 130, and the sensor sets 126b and 126d cover a diameter of the wafer 130. In some exemplary examples, an included angle β 1 between the sensor sets 126a and 126b, an included angle β 2 between the sensor sets 126b and 126c, an included angle β 3 between the sensor sets 126c and 126d, and an included angle β 4 between the sensor sets 126d and 126a are the same. Each of the included angles β 1, β 2, β 3, and 34 may substantially equal to 360/4 (i.e. 90) degrees.

Referring to FIG. 6C again, because the wafer processing tool 100c includes three sensor sets 126a, 126b, 126c, and 126d, the sensor sets 126a, 126b, 126c, and 126d are radially arranged to respectively cover the radiuses of the wafer 130, and the included angles β 1, β 2, β 3, and β 4 are the same, such that the sensor sets 126a, 126b, 126c, and 126d scan and detect the entire top surface 132 or the entire back surface 134 of the wafer 130 while the wafer holder 110 rotates relative to each of the sensor sets 126a, 126b, 126c, and 126d by 90 degrees or each of the sensor sets 126a, 126b, 126c, and 126d rotates relative to the wafer holder 110 by 90 degrees. Thus, the time for detecting the warpage of the wafer 130 is greatly reduced.

FIG. 7 is a schematic top view of a wafer and a sensor set of a wafer processing tool capable of detecting wafer warpage in accordance with some embodiments. In the embodiments, a wafer processing tool 100d includes a wafer holder 110 and one sensor set 128 crossing two opposite edges 138 of the wafer 130 and passing through a center 136 of the wafer 130. In other words, the sensor set 128 is equivalent to the combination of the sensor sets 120a and 120b shown in FIG. 6A. Thus, the sensor set 128 covers a diameter of the wafer 130, and a projection of the sensor set 128 on the wafer 130 radially extends from one of the two opposite edges 138 through the center 136 to the other one of the two opposite edges 138.

Referring to FIG. 7 again, the wafer processing tool 100d includes one sensor set 128, and the sensor set 128 covers the diameter of the wafer 130, such that the sensor set 128 scans and detects the entire top surface 132 or the entire back surface 134 of the wafer 130 while the wafer holder 110 rotates relative to the sensor set 128 by 180 degrees or the sensor set 128 rotates relative to the wafer holder 110 by 180 degrees. Thus, the efficiency of detecting the warpage of the wafer 130 is enhanced.

In some examples, the wafer processing tool may include more than one sensor sets similar to the sensor set 128, and each of the sensor sets crosses two corresponding opposite edges of the wafer 130 and passes through the center 136 of the wafer 130. In these examples, included angles between every two adjacent sensor sets are the same, and each of the included angles is substantially equal to 360/(2n) degrees, where n stands for the number of the sensor sets. For example, when the number of the sensor sets is two, one of the sensor sets may be equivalent to the combination of the sensor sets 126a and 126c shown in FIG. 6C, and the other one of the sensor sets may be equivalent to the combination of the sensor sets 126b and 126d shown in FIG. 6C.

Figure 8:
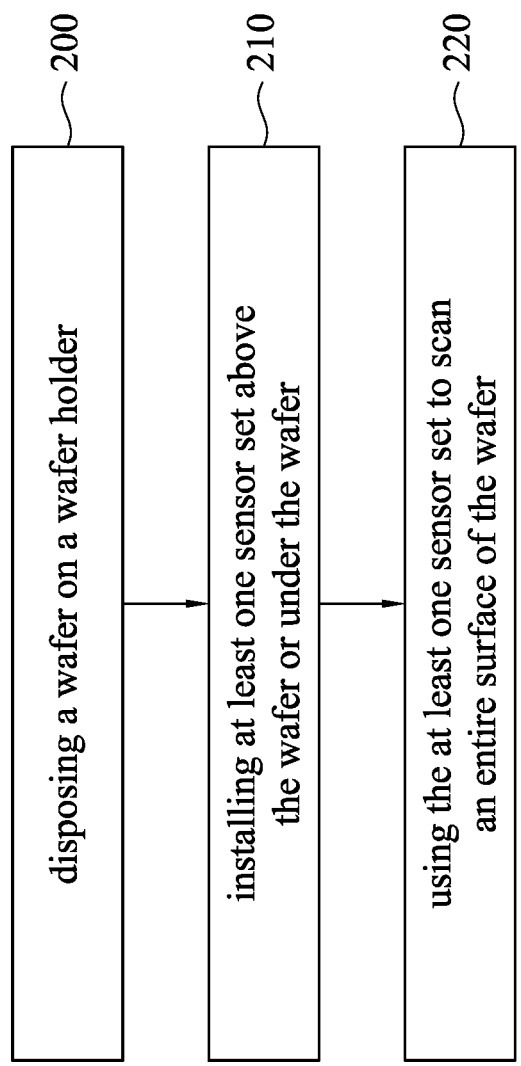
FIG. 8 is a flow chart of a method for detecting wafer warpage in accordance with some embodiments.

Referring to FIG. 8 with FIG. 1, FIG. 8 is a flow chart of a method for detecting wafer warpage in accordance with some embodiments. The method begins at operation 200, where a wafer 130 is provided and disposed on a wafer holder 110. For example, the wafer holder 110 may be disposed within a sorter or a process tool. The wafer sorter is used for sorting wafers in wafer transfer. The process tool is designed to process a wafer. For example, the process tool may be a deposition process tool for depositing various material layers on the wafer, or a planarization process tool for planarizing the material layers. The wafer holder 110 supports and holds the wafer 130. For example, the wafer holder 110 may be a clamp type holder, a chuck type holder, an e-chuck type holder, or a vacuum type holder, and the wafer holder 110 may hold the wafer 130 by using a mechanical force, an electrostatic force, or a vacuum force. The wafer holder 110 may be rotatable, such that the wafer 130 held by the wafer holder 110 may be rotated by the wafer holder 110.

At operation 210, as shown in FIG. 3A, FIG. 3B, FIG. 5A and FIG. 5B, at least one sensor set 120 is installed above the wafer 130 or under the wafer 130. The at least one sensor set 120 is disposed directly above a top surface 132 of the wafer 130 or directly under a back surface 134 of the wafer 130. In some examples, one sensor set 120 is installed, in which a projection of the sensor set 120 on the wafer 130 may radially extend from a center 136 of the wafer 130 to an edge 138 of the wafer 130. In alternative examples, as shown in FIG. 9, the sensor set 120 may cross two opposite edges 138 of the wafer 130 and pass through the center 136 of the wafer 130. In some examples, as shown in FIG. 6A to FIG. 6C, two or more sensor sets 120 are installed, in which a projection of each of the sensor sets 120 on the wafer 130 may radially extend from the center 136 of the wafer 130 to the edge 138 of the wafer 130. Alternatively, a projection of each of the sensor sets 120 on the wafer 130 may cross two opposite edges 138 of the wafer 130 and pass through the center 136 of the wafer 130. When the projection of each of the sensor sets 120 on the wafer 130 radially extends from the center 136 of the wafer 130 to the edge 138 of the wafer 130, each of included angles between any two adjacent sensor sets 120 is substantially equal to 360/n degrees, where n stands for the number of the sensor sets. When the projection of each of the sensor sets 120 on the wafer 130 crosses two opposite edges 138 of the wafer 130 and passes through the center 136 of the wafer 130, each of included angles between any two adjacent sensor sets 120 is substantially equal to 360/(2n) degrees, where n stands for the number of the sensor sets. Each of the sensor sets 120 may be rotatable relative to the wafer holder 110.

At operation 220, referring to FIG. 3A, FIG. 3B, FIG. 5A and FIG. 5B, the sensor sets 120 are used to scan and detect the top surface 132 of the wafer 130 or the back surface 134 of the wafer 130 while the wafer holder 110 is rotated relative to the sensor sets 120 or the sensor sets 120 are rotated relative to the wafer holder 110. After scanning and detecting, a topography of the entire top surface 132 or the entire back surface 134 of the wafer 130 is obtained, and the warpage of the wafer 130 is measured based on the topography of the entire top surface 132 or the entire back surface 134 of the wafer 130.

For example, as shown in FIG. 2, the sensor set 120 scans and detects the entire top surface 132 of the wafer 130 while the wafer holder 110 rotates relative to the sensor set 120 by 360 degrees. As shown in FIG. 6A, the sensor sets 120a scan and detect the entire top surface 132 of the wafer 130 while the wafer holder 110 rotates relative to the sensor set 120a by 180 degrees. As shown in FIG. 6B, the sensor set 124a, 124b, and 124c scan and detect the entire top surface 132 of the wafer 130 while the wafer holder 110 rotates relative to the sensor set 124a, 124b, and 124c by 120 degrees. As shown in FIG. 6C, the sensor set 126a, 126b, 126c, and 126d scan and detect the entire top surface 132 of the wafer 130 while the wafer holder 110 rotates relative to the sensor set 126a, 126b, 126c, and 126d by 90 degrees. As shown in FIG. 7, the sensor set 128 scans and detects the entire top surface 132 of the wafer 130 while the wafer holder 110 rotates relative to the sensor set 128 by 180 degrees.

Referring to FIG. 1 again, after scanning, the method may further use a process device 150 including a central processing unit to measure the warpage of the wafer 130. The process device 150 measures the warpage of the wafer 130 according to the topography data of the entire top surface 132 of the wafer 130 detected by the sensor set 120.

Figure 9B:
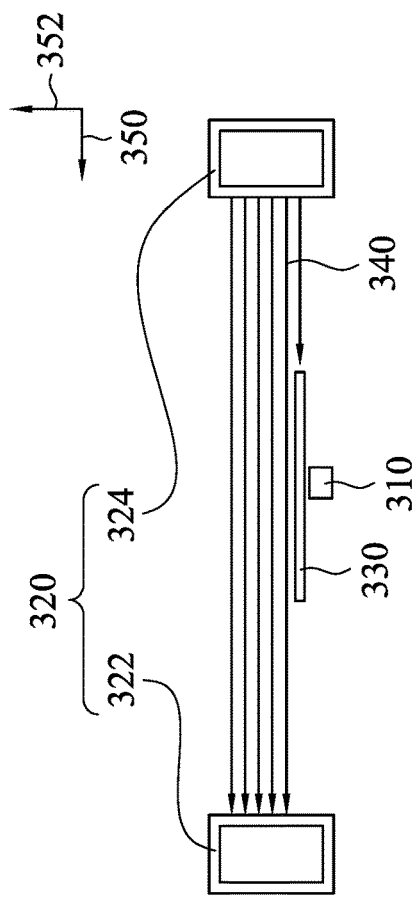
FIG. 9B is a schematic diagram showing a detecting operation of the sensor set shown in FIG. 9A.
Figure 9C:
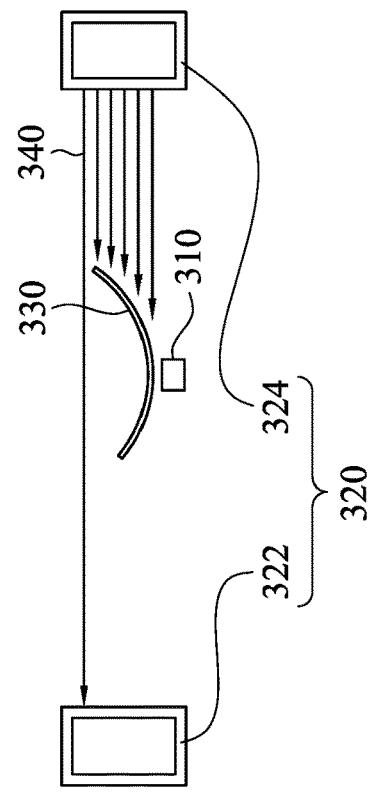
FIG. 9C is a schematic diagram showing a detecting operation of the sensor set shown in FIG. 9A.
Figure 9A:
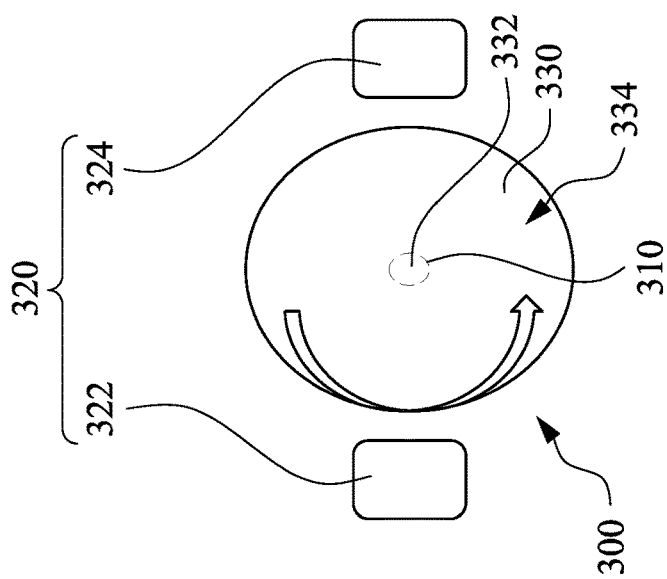
FIG. 9A is a schematic top view of a wafer and a sensor set of a wafer processing tool capable of detecting wafer warpage in accordance with some embodiments.

FIG. 9A is a schematic top view of a wafer and a sensor set of a wafer processing tool 300 capable of detecting wafer warpage in accordance with some embodiments. The wafer processing tool 300 may be, for example, a sorter or a process tool. In some embodiments, the wafer processing tool 300 includes a wafer holder 310 and at least one sensor set 320. In the example shown in FIG. 9A, the wafer processing tool 300 includes one sensor set 320. The wafer holder 310 is configured to support and hold a wafer 330. In some exemplary examples, the wafer holder 310 may be a clamp type holder, a chuck type holder, an e-chuck type holder, or a vacuum type holder, such that the wafer holder 310 may hold the wafer 330 by using a mechanical force, an electrostatic force, or a vacuum force. The wafer holder 310 and the sensor set 320 are rotatable relative to each other, such that the wafer 330 held by the wafer holder 310 and the sensor set 320 are rotatable relative to each other.

In some examples, each of the at least one sensor set 320 includes two sensors 322 and 324. The sensors 322 and 324 are arranged at two opposite sides of a diameter of the wafer 330, such that when the wafer 330 is held on the wafer holder 310, a suppositional line connected centers of the sensors 322 and 324 passes through a center 332 of the wafer 330. For example, the sensors 322 and 324 of the sensor set 320 may include optical sensors.

Similar to the wafer processing tool 100, the wafer processing tool 300 may further include a process device, such as a computer including a central processing unit, and the sensors 322 and 324 of the sensor set 320 are signally connected to the process device. In some examples, one of the sensors 322 and 324 is a transmitting terminal, and the other one of the sensors 322 and 324 is a receiving terminal. FIG. 9B is a schematic diagram showing a detecting operation of the sensor set shown in FIG. 9A, and FIG. 9C is a schematic diagram showing another detecting operation of the sensor set shown in FIG. 9A. In some examples, the sensor 322 is the receiving terminal, and the sensor 324 is a transmitting terminal. In detecting warpage of the wafer 330, the sensor 324 emits various light beams 340 toward the sensor 322 along a first direction 350, and the sensor 322 receives the light beams 340 passing through the wafer 330 while the wafer 330 and the sensor set 320 are rotatable relative to each other. For example, as shown in FIG. 9A, the wafer 330 may rotate relative to the sensor set 320. In some examples, the light beams 340 are parallel to each other, in which the light beams 340 are arranged along a second direction 352 which is perpendicular to a top surface 334 of the wafer 330. Then, the sensors 322 and 324 transmit the data of the light beams 340 to the process device, and the process device measures the warpage of the wafer 330 by using the data of the light beams 340. Thus, the warpage degree of the wafer 330 is obtained from the sensing result of the sensors 322 and 324.

For example, referring to FIG. 9B and FIG. 9C, the more the light beams 340 are blocked by the wafer 330, the more serious of the warpage of the wafer 330 is. In some exemplary examples, as shown in FIG. 9B, when the detecting result is that only one or few of the light beams 340 arranged along the second direction 352 are blocked by the wafer 330, the wafer 330 is not wrapped.

In accordance with an embodiment, the present disclosure discloses a wafer processing tool capable of detecting wafer warpage. The wafer processing tool includes a wafer holder on which a wafer is held, and at least one sensor set. The at least one sensor set is disposed above the wafer or under the wafer, and a projection of each of the at least one sensor set on the wafer radially extending from a center of the wafer to an edge of the wafer. The at least one sensor set is configured to scan an entire surface of the wafer so as to measure warpage of the wafer while the wafer holder and the at least one sensor set are rotatable relative to each other.

In accordance with one embodiment, the wafer holder is a clamp type holder, a chuck type holder, an e-chuck type holder, or a vacuum type holder.

In accordance with one embodiment, each of the at least one sensor set includes various sensors uniformly arranged in a line of the wafer.

In accordance with one embodiment, each of the at least one sensor set includes various ultrasonic sensors, various optical sensors, various RF coupling sensors, or a combination thereof.

In accordance with one embodiment, the wafer holder is rotatable relative to the at least one sensor set which is fixed.

In accordance with one embodiment, the at least one sensor set is rotatable relative to the wafer holder which is fixed.

In accordance with one embodiment, the at least one sensor set is disposed above the wafer to detect a patterned side of the wafer.

In accordance with one embodiment, the at least one sensor set is disposed under the wafer to detect a back side of the wafer opposite to a patterned side of the wafer.

In accordance with one embodiment, the number of the at least one sensor set is more than one, and included angles between any two adjacent sensor sets are the same.

In accordance with one embodiment, each of the included angles is substantially equal to 360/n degrees, where n stands for the number of the sensor sets.

In accordance with another embodiment, the present disclosure discloses a wafer processing tool capable of detecting wafer warpage. The wafer processing tool includes a wafer holder on which a wafer is held, and at least one sensor set. The at least one sensor set is disposed above the wafer or under the wafer, and the at least one sensor set crosses two opposite edges of the wafer and passes through a center of the wafer. The wafer holder and the at least one sensor set are rotatable relative to each other, thereby enabling the at least one sensor set to scan an entire surface of the wafer held on the wafer holder to obtain a topography of the entire surface of the wafer.

In accordance with one embodiment, the wafer holder is a clamp type holder, a chuck type holder, an e-chuck type holder, or a vacuum type holder.

In accordance with one embodiment, each of the at least one sensor set includes various ultrasonic sensors, various optical sensors, various RF coupling sensors, or a combination thereof.

In accordance with one embodiment, the wafer holder is rotatable relative to the at least one sensor set which is fixed.

In accordance with one embodiment, the at least one sensor set is rotatable relative to the wafer holder which is fixed.

In accordance with one embodiment, the number of the at least one sensor set is more than one, included angles between every two adjacent sensor sets are the same, and each of the included angles is substantially equal to 360/(2n) degrees, where n stands for the number of the sensor sets.

In accordance with yet another embodiment, the present disclosure discloses a method for detecting wafer warpage. In this method, a wafer is disposed on a wafer holder. At least one sensor set is installed above or under the wafer. A projection of each of the at least one sensor set on the wafer radially extends from a center of the wafer to an edge of the wafer. The at least one sensor set is used to scan an entire surface of the wafer to obtain a topography of the entire surface of the wafer by rotating one of the wafer holder and the at least one sensor set relative to the other one of the wafer holder and the at least one sensor set.

In accordance with one embodiment, in installing the at least one sensor set, various sensor sets are installed, and each of included angles between every two adjacent sensor sets is substantially equal to 360/n degrees, where n stands for the number of the sensor sets.

In accordance with one embodiment, using the at least one sensor set to scan the entire surface of the wafer is performed by rotating the wafer relative to the at least one sensor set which is fixed.

In accordance with one embodiment, using the at least one sensor set to scan the entire surface of the wafer is performed by rotating the at least one sensor set relative to the wafer which is fixed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer processing tool capable of detecting wafer warpage, the wafer processing tool comprising:
   a wafer holder on which a wafer is held; and
   at least one sensor set disposed above the wafer or under the wafer and facing the wafer, a projection of each of the at least one sensor set on the wafer radially extending from a center of the wafer to an edge of the wafer, wherein the at least one sensor set is configured to scan an entire surface of the wafer so as to measure warpage of the wafer while the wafer holder and the at least one sensor set are rotatable relative to each other,
   wherein the number of the at least one sensor set is equal to 3 or greater than 3.

2. The wafer processing tool of claim 1, wherein the wafer holder is a clamp type holder, a chuck type holder, an e-chuck type holder, or a vacuum type holder.

3. The wafer processing tool of claim 1, wherein each of the at least one sensor set comprises a plurality of sensors uniformly arranged in a line of the wafer.

4. The wafer processing tool of claim 1, wherein each of the at least one sensor set comprises a plurality of ultrasonic sensors, a plurality of optical sensors, a plurality of RF coupling sensors, or a combination thereof.

5. The wafer processing tool of claim 1, wherein the wafer holder is rotatable relative to the at least one sensor set which is fixed.

6. The wafer processing tool of claim 1, wherein the at least one sensor set is rotatable relative to the wafer holder which is fixed.

7. The wafer processing tool of claim 1, wherein the at least one sensor set is disposed above the wafer to detect a patterned side of the wafer.

8. The wafer processing tool of claim 1, wherein the at least one sensor set is disposed under the wafer to detect a back side of the wafer opposite to a patterned side of the wafer.

9. The wafer processing tool of claim 1, wherein included angles between any two adjacent sensor sets are the same.

10. The wafer processing tool of claim 9, wherein each of the included angles is substantially equal to 360/n degrees, where n stands for the number of the at least one sensor set and satisfies 3.

11. A wafer processing tool capable of detecting wafer warpage, the wafer processing tool comprising:
    a wafer holder configured to hold a wafer; and
    a plurality of sensor sets, wherein a projection of each of the sensor sets on the wafer holder extends radially from a center of the wafer holder, the number of the sensor sets is equal to 3 or greater than 3, and the wafer holder and the sensor sets are rotatable relative to each other, thereby enabling the sensor sets to scan an entire surface of the wafer held on the wafer holder to obtain a topography of the entire surface of the wafer while all sensors of the sensor sets face the wafer.

12. The wafer processing tool of claim 11, wherein sensors of each of the sensor sets comprise a plurality of ultrasonic sensors, a plurality of optical sensors, a plurality of RF coupling sensors, or a combination thereof.

13. The wafer processing tool of claim 11, wherein the wafer holder is rotatable relative to the sensor sets which are fixed.

14. The wafer processing tool of claim 11, wherein the sensor sets are rotatable relative to the wafer holder which is fixed.

15. The wafer processing tool of claim 11, wherein included angles between every two adjacent sensor sets are the same.

16. The wafer processing tool of claim 11, wherein included angles between every two adjacent sensor sets are greater than 0 degrees and smaller than 180 degrees.

17. A method for detecting wafer warpage, the method comprising:
    disposing a wafer on a wafer holder;
    installing at least one sensor set above or under the wafer, wherein a projection of each of the at least one sensor set on the wafer extends radially from a center of the wafer to an edge of the wafer, and the number of the at least one sensor set is equal to 3 or greater than 3; and
    using all sensors of the at least one sensor set to scan an entire surface of the wafer to obtain a topography of the entire surface of the wafer by rotating one of the wafer holder and the at least one sensor set relative to the other one of the wafer holder and the at least one sensor set.

18. The method of claim 17, wherein using the at least one sensor set to scan the entire surface of the wafer is performed by rotating the wafer relative to the at least one sensor set which is fixed.

19. The method of claim 17, wherein using the at least one sensor set to scan the entire surface of the wafer is performed by rotating the at least one sensor set relative to the wafer which is fixed.

20. The method of claim 17, wherein using the at least one sensor set to scan the entire surface of the wafer is performed such that projection of all sensors of the at least one sensor set are located on the wafer.

* * * * *